(12) United States Patent
Dooling et al.

(10) Patent No.: US 7,434,185 B2
(45) Date of Patent: Oct. 7, 2008

(54) METHOD AND APPARATUS FOR PARALLEL DATA PREPARATION AND PROCESSING OF INTEGRATED CIRCUIT GRAPHICAL DESIGN DATA

(75) Inventors: Daria R. Dooling, Huntington, VT (US); Kenneth T. Settlemyer, Jr., Poughquag, NY (US); Jacek G. Smolinski, Jericho, VT (US); Stephen D. Thomas, Essex Junction, VT (US); Ralph J. Williams, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 62 days.

(21) Appl. No.: 11/535,789

(22) Filed: Sep. 27, 2006

(65) Prior Publication Data

US 2008/0077891 A1  Mar. 27, 2008

(51) Int. Cl.
*G06F 17/50* (2006.01)
(52) U.S. Cl. ............... 716/5; 716/4; 716/7; 716/11
(58) Field of Classification Search ............ 716/4, 716/5, 7, 11; 345/502, 504; 707/104
See application file for complete search history.

(56) References Cited

U.S. PATENT DOCUMENTS

| | | | |
|---|---|---|---|
| 5,128,878 A * | 7/1992 | Gore et al. | 345/502 |
| 5,936,642 A * | 8/1999 | Yumoto et al. | 345/504 |
| 6,415,421 B2 | 7/2002 | Anderson et al. | |
| 6,611,946 B1 | 8/2003 | Richardson et al. | |
| 6,968,346 B2 * | 11/2005 | Hekmatpour | 707/104.1 |
| 6,983,440 B1 | 1/2006 | Nequist | |
| 7,051,307 B2 | 5/2006 | Ditlow et al. | |

OTHER PUBLICATIONS

Gregoretti, et al. "Analysis and Evaluation of VLSI Design Rule Checking implementation in a multiprocessor", 1984 IEEE, Supplied by The British Library, pp. 7-14.

Difrenza, et al., "Effect of Substrate Voltage and Oxide Thickness on NMOSFET Matching Characteristics for a 0.18 μm CMOS Technology", International Conference on Microelectronic Test Structures, Kobe, Mar. 19-22, 2001, ICMTS 2001 Proceedings, pp. 7-10.

(Continued)

*Primary Examiner*—Sun J Lin
(74) *Attorney, Agent, or Firm*—Scully, Scott, Murphy & Presser, P.C.; Ryan K. Simmons, Esq.

(57) ABSTRACT

A method for implementing an ORC process to facilitate physical verification of an integrated circuit (IC) graphical design. The method includes partitioning the IC graphical design data into files by a host machine such that the files correspond to regions of interest or partitions with defined margins, dispersing the partitioned data files to available cpus within the network, processing of each job by the cpu receiving the file, wherein artifacts arising from bisection of partitioning margins during the partitioning, including cut-in-duced false errors, are detected and removed, and the shape-altering effects of such artifact errors are minimized and transmitting the results of processing at each cpu to the host machine for aggregate processing.

10 Claims, 3 Drawing Sheets

OTHER PUBLICATIONS

Maxim, et al., "Novel Physical Based Model of Deep-submicron CMOS Transistors Mismatch for Monte Carlo Spice Simulation", IEEE International Symposium on Circuits and Systems, Sydney, May 6-9, 2001, ISCAS 2001, vol. 5, pp. 511-514.

Croon, et al., "Influence of Doping Profile and Halo Implantation on the Threshold Voltage Mismatch of a 0.13 µm CMOS Technology", European Solid-State Device Research Conference, 32nd, Firenze, Sep. 24-26, 2002, ESSDERC 2002 Proceedings, pp. 579-582.

Yang, et al., "Current Mismatch due to Local Dopant Fluctuations in MOSFET Channel", IEEE Transactions on Electron Devices, vol. 50, Issue 11, Nov. 2003, pp. 2248-2254.

Galup-Montoro et al., "Compact Model of MOSFET Mismatch for Circuit Design", IEEE J. of Solid-State Circuits, vol. 40, Issue 8, Aug. 2005, pp. 1649-1657.

* cited by examiner

METHOD AND APPARATUS FOR PARALLEL DATA PREPARATION AND PROCESSING OF INTEGRATED CIRCUIT GRAPHICAL DESIGN DATA

BACKGROUND OF THE INVENTION

1. Field of the Invention

The present invention relates to data preparation and manipulation for integrated circuit graphical design. More particularly, the inventions disclosed and claimed herein relate to methods and apparatus for automatically and intelligently partitioning data comprising integrated circuit (IC) graphical designs for distribution and processing by multiple network computer resources as separate tasks defined by the partitioning with minimal partition-related errors, faster throughput of aggregate tasks and more efficient use of parallel compute resources (improved scalability).

2. Description of the Related Art

The characteristics of today's complex IC designs have made accelerated processing of graphical design data an essential part of design-to-silicon processes. To achieve profitability, design houses and fabs alike must be capable of processing huge and complicated volumes of design data swiftly. As IC technology continues to miniaturize, support hardware and application programs required to reliably print the minimum feature sizes on silicon tends to lag behind, further widening sub-wavelength gaps. For physical verification, or real checking of very large scale IC designs, non-equipment based technologies like phase-shifted masks (PSM), optical proximity checking (OPC) and optical rules checking (OPC) are required to process sub-wavelength data ever more quickly, efficiently and accurately. That is, with respect to sub-wavelength technologies, resolution enhancement techniques and the corresponding increase in the numbers of processing operations, and corresponding processing times for the sub-wavelength chip geometries. The operations must be carried out to move the design data through the stages of the manufacturing cycle. To that end, various partitioning schemes and processes have developed to accommodate these ever-increasing processing demands.

The skilled artisan should fully understand that partitioning a graphical design to facilitate parallel processing might itself generate errors and processing bottlenecks. The cutting or partitioning of a chip design may affect the ability of the presently available verification tools and platforms to process the separate tasks in an efficient timely manner. Ineffective or inefficient use of network compute resources inherently adds time to overall verification, and cost money. Known automatic partitioning of an IC graphical designs for distributed processing reflect increasing processing overhead, particularly at sub-wavelength dimensions are "inefficient." That is, known partitioning techniques do not partition the design to facilitate scalability in a distributed processing environment (scalability of a task in a multiple cpu network), and therefore process inefficiently. Limitations arising from communication overhead required to process conventionally partition real check tasks throughout available network resources results in the underutilization, and limited scalability of the same distributed network available compute resources.

For example, U.S. Pat. No. 7,051,307 (the '307 patent), commonly-known and incorporated by reference herein, discloses a process for automatic graphical partitioning of IC graphical design data to better facilitate post-partition processing. The '307 patent processes analyze the hierarchy, and graphical nature of a circuit design to define the most appropriate locations and sizes of windows (or partitions), adapting the partitioning to the inherent character of the IC design (physical design). For example, the '307 patent suggests that it is preferable to partition in such a way that an entire macro defines partition margins in the design. If the partitions are too large, or too small, distributed processing may not improve overall processing times, nor effectively utilize system compute resources.

FIG. 1 shows a schematic flow diagram of a known master process for hierarchical partitioning of graphical design data for electronic design automation, or EDA-type applications. Block 100 of FIG. 1 represents the master AGP process start step, and block 110 represents a step where the IC graphical design data are processed for initial validation of the proposed circuit design. Block 120 represents a step of partitioning the design data, and block 130 represents a step wherein tasks are "built" for processing the partitioned data by the resources available. Block 140 represents a step of task submission across the network of machines or cpus, and block 160 represents a step where the process loops until all the dispersed or distributed tasks are completed. Once the correct size and number of logical blocks is found (for example, by the step of block 130), the process eliminates duplicate logical blocks and overlapping logical blocks that overlap above an "overlap percentage limit." The step partitions the proposed block structure when the rules are met.

After submitting the tasks across the network of allocated cpus (block 140), the designated cpus run separate physical verifications of design features (e.g., design rule checking (DRC), optical rule checking (ORC), optical proximity checking (OPC), etc.) inherent in the partitioned data. OPC by its nature restructures and removes a great deal of the hierarchy, and being context dependent, flattens the data to some extent. But even with the best hierarchy management techniques, file sizes, data types and data volumes typically grow non-linearly, increasing data processing requirements. With such large amounts of data for processing, the increased use of parallel or distributed processing of partitioned design data increases efficiency in processing very large numbers of DRC-like operations (e.g., Boolean operations, width and space measurements involving design layout shapes), and advanced resolution enhancement techniques, such as optical proximity correction (OPC), scattering bar generation, etc.

Block 170 (of FIG. 1) depicts a step in the '307 patent process wherein the overall post-processing results are assessed (automatically). The success of same processing tasks may be determined in the step represented by block 180. If the tasks were all successful, the user is notified as per the step of block 185, and the process stops (block 195). But if all tasks did not run successfully, the process resubmits the incomplete tasks for further processing, as can be seen by the step of block 180. But even with AGP-like partitioning, improved scalability and reduction in overall physical verification processing times is not a given. For example, ORC-like operations do not scale well beyond several dozen cpus in a distributed processing scheme, depending on the application or platform managing the processing, and some may not scale well beyond 3 or 6 cpus.

Improved scalability of data prep operations in a distributed processing network environment, to improve throughput time and fully scale to available network cpus would improve application to such processing tasks by known tools. That is, with emerging technologies, e.g., 45 nm technologies, will be so large, and the operations so complex, that a distributed processing system capable of processing such tasks in a timely manner is expected to require scalability on the order of 1000 cpus, to "contain" aggregate real check run times. Today, DRC-like operations are processed using multithreaded approaches, which inherently do not scale well. Available vendor tools tend to not efficiently utilize parallel compute resources by, for example, designating a cpu or machine for a particular task based on the task (partitioned data to be processed), and the machine or cpu ability. For that matter, scaling, or scalability, is a metric used to provide some indication as to how well an EDA process or application utilizes available compute resources. DRC tape-out flow is limited by data translation time, run time, debug time, etc. DRC, OPC and CRC cycles are iterated many times while the designers check, fix and recheck the design during tape-out flow. Only after full chip assembly can the final verification begin.

BRION, Inc., manufactures an integrated hardware/software platform that makes extensive use of hardware accelerators to expedite DRC-like operations to improve processing efficiency for performing large numbers of DRC-like operations. The BRION platform, however, is very expensive. SYNOPSIS, Inc., and MENTOR GRAPHICS, Inc., provide software that scales to large node counts to distribute data for DRC-like processing, and resolution enhancement processing, across a network's allocated compute resources (parallel processing). The MENTOR Graphics software, however, does not scale well for the anticipated large node counts needed to process shrinking technology, e.g., 45 nm node technologies. And while the SYNOPSIS software may scale better then the MENTOR GRPHICS technologies, the SYNOPSIS application is not arranged to "efficiently" perform resolution enhancement operations, such as optical rule checking (ORC), optical proximity correction (OPC), etc.

Multithreading and distributed processing are parallel computing approaches which attempt to utilize parallel compute resources, and a main memory services or resources, to render a real checking more efficient. Multithreading works well only for "small" tasks, because memory contention ensures that these systems lose their scalability and speed limits with the number of cpus in the compute resources exceeds about 10 or 12 cpus. Synopsis, for example, utilizes distributed processing and hybrid OPC in an effort to realize improved scalability, to manage the hierarchy over a network of cpus rather than one, or four (4). The Synopsys tools partition the design into tasks, and distribute the tasks in pieces to individual compute resources for processing, and the processed pieces are returned and patched together. But as mentioned, conventional arbitrary partitioning of a design into smaller regions (for easier processing by a cpu) runs the risk of cutting through shapes (which might correspond to a macro). Cut shapes raise processing errors in various ways, including margin errors where partition margins or boundaries complicate processing by correction algorithms. The processes encounter problems or increased communication overhead where the size of arbitrarily partitioned shapes falls below the minimum size the applied algorithm was designed to accommodate.

The skilled IC graphical designer would welcome a vendor tool or platform that can automatically partition input data with an eye to distributed processing to significantly reduce overall processing times for ORC and/or OPC-like operations upon the partitioned data by effectively and efficiently using all available in-network cpus or compute resources.

SUMMARY OF THE INVENTION

To that end, various inventive processes and apparatus are described and set forth herein that automatically partition IC graphical design input data about a distributed processing environment that allows for processing of smaller tasks by the individual compute resources available in network for improved scalability. That is, the inventive processes and systems divide or partition the graphical design data into small files corresponding to smaller tasks to better leverage conventional distributed processing platforms and systems for improved scalability. And as mentioned above, the need is particularly pressing for anticipated increased data loads expected with 45 nm technology. The network cpus that receive and process the tasks attempt to minimize communication overhead by processing the jobs in smaller lots so the process does not go non-linear when errors are generated, or complication other complications that could arise from arbitrary partitioning. This is particularly important with respect to ORC-like operations.

The inventive systems and processes execute ORC-like task steps by running them in sequence individual pieces or cpus available in the distributed processing network rather than waiting for the operation(s) to be completed for all pieces (tasks), and reassembling the chip. As mentioned above, where the technology is advanced, e.g., 45 nm node, ORC errors tend to be more frequent, and generate more problems and communication overhead. Margin-boundary induced errors are particularly troubling with respect to ORC operations, as understood by the skilled artisan. That is, conventional ORC processes can be problematic in distributed processing where shapes cut during data-partitioning creates splinters, slivers, artifacts, etc., which artifacts may cause large numbers of false errors (millions). The slivers, splinters or other partitioning artifacts are removed by inventive systems and processes at the individual cpu that received the job and its partitioned data, and the processed data returned for aggregate reconstruction.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF THE PREFERRED EMBODIMENT OF THE INVENTION

The inventive methods, software and apparatus set forth herein automatically and intelligently partitions IC graphical design data into portions that are readily processed by available network resources in a distributed processing network, without the deleterious effects that arbitrary data partitioning could have on aggregate processing time for a large scale real check or design verification. At the processing level (at the cpu processing a particular design piece or job), the cpu executes the slated operations on the received data file (with the partitioned data) while implementing an inventive splinter or margin line removal process. The sliver removal process, which in its simplest implementation removes or eliminates windowed splinters or other artifacts which could affect ORC-like processing operations to generate bottlenecks or communication overhead.

Before an individual cpu in a distributed processing environment can carry out ORC processes on the design, the graphical design must first be characterized or separated into at least three data levels. There is a target level, an OPC output level and a simulated wafer level. These are three different representations of the same image, but the shapes on each level are not necessarily coincident. Because of the way the OPC output and the simulated wafer level are generated, splinters or other artifacts may result from partitioning in one or more of the three levels (but not necessarily on all of them). The mismatch can create millions of false errors. Regardless of the number of errors, however, splinters or artifacts generated in the design partitioning, or shapes' operation errors must be noticed, and corrected if what is printed is ever to match the target shape. Put another way, the invention not only addresses sliver removal, but the inventive sliver-removal processes supports content shape retention, simplifying checking, which shows in aggregate check time improvements.

That is, slivers or partitioning-related errors may cause, or cause to be generated, more than one OPC shape associated with the design shape. For that matter, splinters associated with a design shape that is no longer present may nevertheless remain as part of the design data. The splinters present are likely to generate associated print simulation errors. Print simulation errors include false shorts, opens, or related errors showing into the region of interest, etc. This naturally increases communication overhead in distributed processing systems and applications. By overcoming partition-generated errors at the cpu level, smaller jobs may be more readily distributed, processed concurrently, and returned in a way that takes full advantage of available distributed processing network resources to shorten and simply OPC-like processing with improved scalability. This obviates the need for larger server-class machines to carry out the verification processes.

Figures 1, 2:
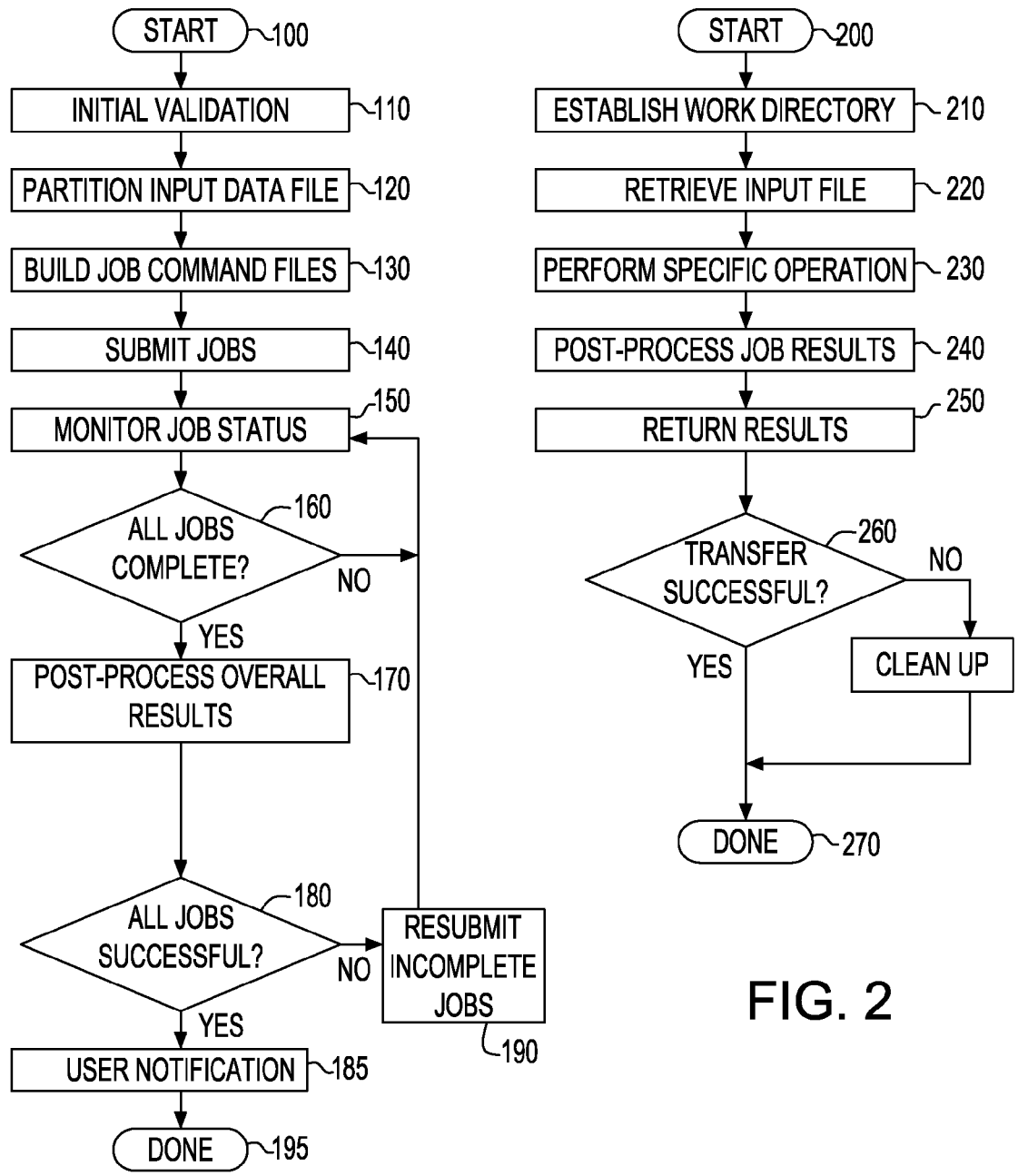
FIG. 1 is a flow block, which broadly defines a conventional master process for partitioning IC graphical designs for distributed processing.
FIG. 2 is a flow diagram of one embodiment of the inventive parallel data preparation and distributed processing of the invention.

To implement the invention, existing or known code and processes for carrying out conventional DRC-like, and resolution enhancement-like operations in a distributed processing environment need only be slightly modified. That is, the modification must accommodate and recognize the inventive "windowing" approach to data partitioning including the splinter removal. It is the code used to implement the ORC and OPC operations that essentially allows for smaller jobs. But only with error free partitioning can improved times and improved scalability of the processes to available resources be realized. Any code that carries out the inventive processes is likely to suffer an increased communication overhead including implementing tedious and operation intensive processes to respond to errors reported at positions within the wafer volume that abut or span the partition boundaries. To that end, FIG. 2 is a schematic flow diagram for the inventive process that could by "called" or implemented within a master process (such as the FIG. 1 AGP process), or called as a stand-alone process. For example, the FIG. 2 process could be called by the FIG. 1 process from the step of block 110 therein (FIG. 1), or the step of block 120 therein. The inventive process as depicted in the FIG. 2 example, however, may readily operate or be implemented as a remote process, independent of a master process such as that depicted in FIG. 1.

The exemplary process begins with start a step such as represented by block 200, and a working directory for the files generated by the process is established by the step represented by block 210. The input file is retrieved by the step represented by block 220, and specific DRC-like or resolution enhancement type operations), are specifically performed, as indicated by block 230. A post-processing step, represented by block 240, provides the post-process results, which are returned (as the case may be) in a step represented by block 250. The inventive post-processing code (as modified by the inventive concepts taught hereby) concurrently filters or removes cut-induced (margin-boundary) errors at each machine or cpu designated for the task, and includes summarizing the results across all independent tasks. If the transfer of results is successful, the step represented by block 260 either completes the task (block 270, or performs a clean up step, represented by block 280.

So by implementing this approach, the original full-chip layout data are first partitioned into individual files, each containing sections of data. The partitioning algorithm attempts to partition the data along macro boundaries, only resorting to geometric partitioning if the pieces are larger than a pre-cut set point. Each piece is arranged to include a frame region (ROI; see FIG. 4) of sufficient size to render operations in one piece independent from those in another piece, with one job per file. A load leveler process distributes the jobs across multiple systems or cpus, matching job requirements (memory, number of processors, etc.) to the systems with requested characteristics.

By keeping the size of the partitions consistent with the desired run time goal for a relatively small number of processors, conventional vendor applications and platforms operated as modified by the inventive processes show good or improved scalability. When an individual job is assigned to a particular machine, system or cpu comprising the distributed processing network, the process first creates a temporary working directory (for example, on local DASD). It then retrieves its assigned data section via FTP communication with the system, machine or cpu where the data resides. When processing (local at the cpu of system) is complete, the resulting files (data log, etc.) are transmitted back to the original system via FTP and placed in a named subdirectory. The progress of jobs is preferably monitored so that when all jobs are completed, the final aggregation of data and results occurs. Data files are merged and a final summary is produced. Resubmission of unsuccessful jobs is automatic.

Figure 3:
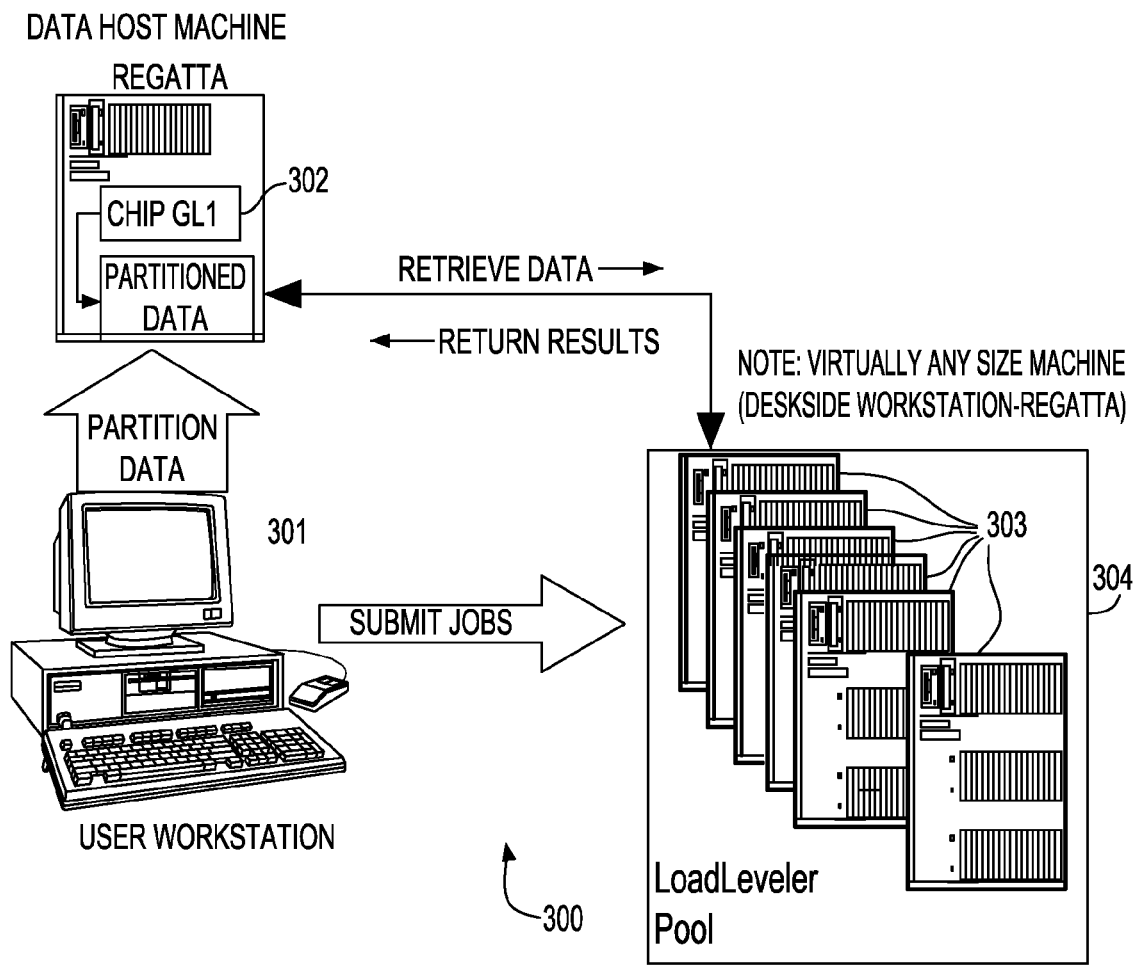
FIG. 3 is a system-level design of an IC graphical design verification system which allows processing in accordance with the inventive concepts herein.

FIG. 3 is a system level schematic representation of one implementation of an integrated system 300 of the invention, including a user workstation 301 and a data host machine, i.e., Regatta. The inventive processing is implemented in the FIG. 3 constructions partitions a region of interest to facilitate improved scalability by sliver removal and content shape retention. Workstation 301 operates in unison with a host machine 302 to partition the graphical design data, preferably based on heuristically determined regions of interest, and includes available memory for storing the design, and the partitioned data. Section 304 of FIG. 3 idealizes how the partitioned data are distributed to the available cpus 303 (compute resources) in the host workstation.

Ideally, each partition contains a frame region of sufficient size to render operations in the piece or file partition independently of the other pieces or file partitions. This would imply one task or thread for each partitioned file. The individual tasks are dispatched to a task scheduling system, such as Loadleveler or LSF (not shown in detail in FIG. 3), to distribute the tasks across multiple systems or machines by matching task requirements (e.g., memory, number of processors or cpus, etc.) to the cpus allocated in the network (sometimes referred to as the Loadleveler pool or compute resources). By keeping the size of the partitions consistent with desired runtime goals for a relatively small number of processors, conventional processing tools or applications are operated in such a way that they effectively scale. However, where conditions are not ideal, and partitioning is not always "clean," the processes disclosed hereby distribute the tasks to particular machines suited for each task. The cpu or machine processes out errors generated by partitioning, thereby making effective and efficient use of the network resources and realize shorter run times.

This is particularly important when partitioning to efficiently and concurrently performing intensive data processing applications such as design rule checking (DRC), optical rule checking (ORC), and optical proximity correction (OPC), where the proximity of one shape to another is an important design factor, and accommodating potential errors (partition-related artifact errors) arising during concurrent processing. The process is as long as it takes to process the worst-case machine time.

Figure 4:
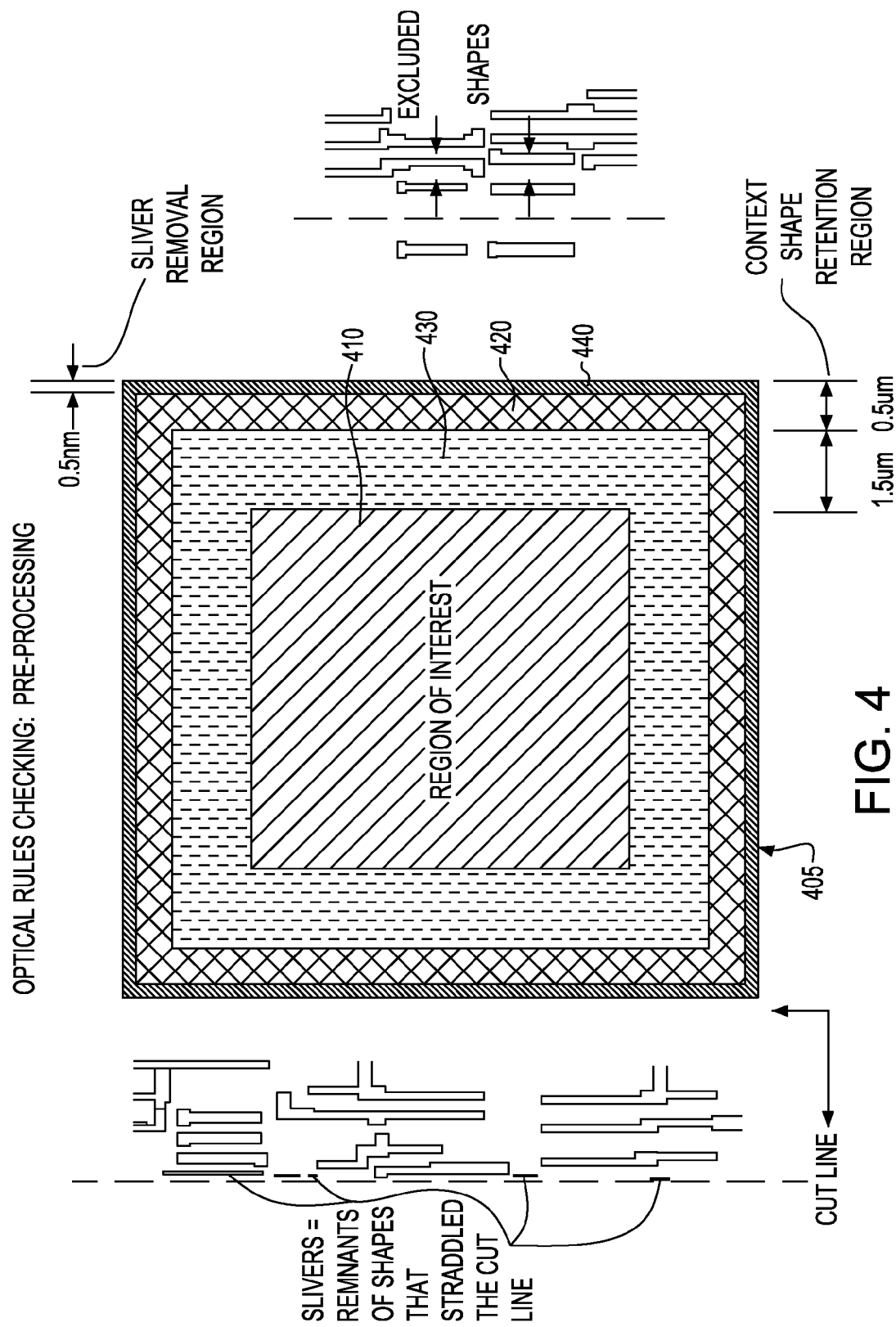
FIG. 4 shows an IC arranged to implement the inventive parallel data processing of this invention.

FIG. 4 shows a portion of an IC, which is a physical region of interest corresponding to a partitioning, by which the sliver removal and shape retention may be readily understood. That is, the inventive processes preserve the proximity of the inventive layout of a device such as IC or wafer portion 405 by analyzing the design shapes comprising the ROI with respect to four (4) regions. A first region 410 is referred to as the region of interest (ROI). A second or far region 420 is the outermost region of the partition, which includes the region of interest 410 and region 430 immediately surrounding the region of interest 430. In the far region, optical effects are still linked to the region of interest, and may be affected by optical effects linked to the region of interest. A fourth region is defined as the thin ring 440, which thin ring is relatively small on the inside of the far margin 420, and is used for partition artifact or splinter removal by the inventive process. Put another way, thin ring 440 may be thought of as occupying the outer portion or ring of the far margin.

Inventive shapes-handling code is included in the ORC process to define the regions, and very thin outer ring of the far margin. The code required to process each CRC-like job by each cpu in the distributed environment identifies and removes any "windowed" splinters or artifacts in the partitioned data generated by margin bisection, and attempts to accommodate any other associated cut-induced false errors (see "cut line" of FIG. 3). If not removed, artifact errors arising from bisected ROI or partition margins confuse the applied processes (e.g., ORC) implemented at each cpu. By detecting margin-induced errors, the inventions avoid wasting processing time by attempting to process or make sense of detected phantom shapes caused by splinters. The inventive processes further remove, or obviate the deleterious effects of caused by splinters that are present and suggest the presence of shapes that are not really present in the data (failure to identify shape pairs). Any artifacts arising from partitioning and parallel processing must be eliminated, and are eliminated by the inventive processes and systems to obviate generating associated print simulation errors of false shorts, opens, or related errors showing into the region of interest.

The shape-handling code may be called by a main ORC process at the Cpu. The added code preferably includes functionality whereby all other cut-induced false errors are easily removed from the area outside the region of interest. The skilled artisan will note, however, that in some cases, there may be same-net connectivity interdependencies or layers that contain complex large-vertices that require more complex handling. The complex handling typically includes processing in all four of the above-defined regions. While the above-described inventive processing works effectively and efficiently where the integrated circuit is merely geometrically partitioned into m×n pieces or parts, the resulting output is typically larger due to hierarchical flattening of the data. It is readily understood by the skilled artisan, the best case run times to be realized by implementing the inventive process equals the time for partitioning the data, plus the time of the longest running individual piece or task. That is why scaling and effective load distribution is so important. When the size of the partitioned data is well suited to the system resources assigned (partition, task, region, etc.), processing may be conducted with minimal communication overhead. The inventions carry out the partitioning, distribution and processing of tasks to fully utilize the target processors (great scalability) to operate on the partitioned data with minimal partition-related error to reduce overall run-time.

Such approach to the problems solved hereby essentially pipelines OPC and ORC job steps by running them in sequence in individual pieces rather than waiting for the OPC to complete for all the pieces or partitions, and reassembling the chip to submit for ORC. Where the technology is smaller, or more advanced, ORC errors are frequent, so the inventive techniques permit quicker determination. That is, it is relatively quickly determined where data are not suitable for mask build than those processes and platforms implementing convention OPC and ORC on sequence on fill chip data sets.

For that matter, scalability of the allocated machines or cpus in an network programmed to operate in accord with the inventions herein may reach upwards of 95% or 98%, with large numbers of cpus. The skilled artisan will note that cases may arise in which there are same-net connectivity interdependencies or layers that contain complex large vector count polygons requiring more complex region handling that required by the example set forth, where all four of the so-defined four (4) regions must be processed to realize the desired outcome. In this variation on the above-described process, or system operation, all of the splinters for each layer are identified, and those splinters that touch the thin ring are selected in order that the physical verification process avoids missing errors in the region of interest. The splinters are expanded by an amount sufficient to cover variations between the three layers. Thereafter, the selected, expanded splinters are subtracted from all three levels.

In the foregoing specification, the invention has been described with reference to specific embodiments. It will, however, be evident that various modifications and changes can be made thereto without departing from the broader scope and spirit of the invention. The specification and drawings are, accordingly, to be regarded in an illustrative rather than a restrictive sense.

What is claimed is:

1. A method for distributed processing of IC graphical design data to verify or check an IC physical design that partitions the IC graphical design data into pieces that support scaling in view of available network resources for processing the pieces, the method comprising steps of:
    partitioning the IC graphical design data into files by a host machine, wherein the files correspond to regions of interest within the IC graphical design data;
    dispersing the partitioned IC graphical design data files to available CPUs within a network;
    processing of each job by one of the available CPUs receiving the partitioned IC graphical design data files, wherein artifacts arising from bisection of partitioning margins during the partitioning, which could generate cut-induced false errors if not removed from the partitioned IC graphical design data files, are detected and removed, and shape-altering effects of such artifact errors are minimized; and transmitting results of the processing at each CPU to the host machine for aggregate processing, wherein smaller jobs support improved scalability and shorter aggregate real check times.

2. The method as set forth in claim 1, wherein the step of processing includes pipelining OPC and ORC task steps in sequence to quickly determine suitability for a mask build.

3. The method as set forth in claim 1, wherein the step of pipelining ORC includes using shape-handling code to define a very thin outer ring of a shape's far margin, so that the very thin outer ring can be utilized to identify and remove artifacts, and/or artifact-induced error.

4. The method as set forth in claim 3, wherein the step of processing requires processing all regions to identify artifacts in layers comprising the IC physical design, selecting artifacts that contact the very thin outer ring, expanding the artifacts in amounts sufficient to cover variations between layers, and subtracting the artifacts from all three levels.

5. The method as set forth in claim 4, wherein the artifacts include slivers, splinters, cut-margins, mis-shapes and phantom shapes arising out of the partitioning.

6. The method as set forth in claim 1, wherein the step of processing includes implementing ORC task steps in sequence to quickly determine suitability for a mask build.

7. The method as set forth in claim 1, wherein the step of processing includes a parallel implementation of resolution enhancement techniques (RET), pipelined with DRC-like operations.

8. The method as set forth in claim 1, wherein the step of processing includes parallel implementation for optical rules checking and optical proximity correction (OPC), optical rules checking (OPC) and resolution enhancement techniques (RET).

9. A computer-readable medium comprising a set of computer-readable instructions that upon execution by a processor, implement a distributed processing method for checking or verifying an integrated circuit (IC) graphical design data that improves scalability of verification tasks to effectively utilize available network compute resources or CPUs, the method comprising steps of:

partitioning the IC graphical design data by a host processor to generate files corresponding to each partition or region of interest (ROI) to be processed by separate CPUs, dispersing the partitioned IC graphical design data files to the available CPUs for processing; and processing each partitioned IC graphical design data file by a CPU processor to remove artifacts generated by bisection of partition margins, and related cut-induced false errors to improve job scalability in view of the available CPUs, and improve aggregate real check processing run times.

10. A distributed processing network for physical verification of an integrated circuit (IC) graphical design, wherein the distributed processing network automatically and intelligently partitions the IC graphical design into data files for distributed processing by processors comprising in the distributed processing network, dispersing the data files to allocated processors, individually processing each separate file to minimize aggregate verification processing times, and maximize scalability of the aggregate task across available in-network compute resources, comprising:

a plurality of processors;

a user workstation in communication with the plurality of processors; and a data host machine in communication with the user workstation and the plurality of processors, wherein user instructions submitted to the data host machine partition the IC graphical design into data partitions with fixed margins, and wherein data partition size is calculated to allow for effective processing of each data partitions by a particular processor suitable and available for the processing;

dispersing the data partitions as individual processing tasks for being processed by the particular processors allocated for such tasks; and processing each task at each processor to remove artifacts arising from bisection of partitioning margins during partitioning, including cut-induced false errors, thereby resulting in improved network processor use and run times for aggregate processing.

* * * * *